United States Patent
Fushimi et al.

(10) Patent No.: US 8,664,017 B2
(45) Date of Patent: Mar. 4, 2014

(54) METHOD OF MANUFACTURING ORGANIC LIGHT EMITTING DEVICE

(71) Applicant: Canon Kabushiki Kaisha, Tokyo (JP)

(72) Inventors: Masahiro Fushimi, Mobara (JP); Junya Tamaki, Chiba (JP); Manabu Otsuka, Narashino (JP); Takuro Yamazaki, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/761,597

(22) Filed: Feb. 7, 2013

(65) Prior Publication Data
US 2013/0210176 A1 Aug. 15, 2013

(30) Foreign Application Priority Data
Feb. 14, 2012 (JP) ................................. 2012-029730

(51) Int. Cl.
*H01L 21/00* (2006.01)

(52) U.S. Cl.
USPC .............................................. 438/26; 438/99

(58) Field of Classification Search
USPC ............................................... 438/30, 99, 26
See application file for complete search history.

(56) References Cited

U.S. PATENT DOCUMENTS

| 5,656,508 | A | * | 8/1997 | So et al. .......................... 438/34 |
| 5,681,756 | A | * | 10/1997 | Norman et al. ................. 438/35 |
| 7,534,557 | B2 | | 5/2009 | Tachikawa et al. |
| 7,914,976 | B2 | | 3/2011 | Tachikawa et al. |

FOREIGN PATENT DOCUMENTS

| JP | 4544811 B2 | 9/2010 |
| JP | 4578026 B2 | 11/2010 |

* cited by examiner

*Primary Examiner* — Richard Booth
(74) *Attorney, Agent, or Firm* — Fitzpatrick, Cella, Harper & Scinto

(57) ABSTRACT

Provided is a method of manufacturing an organic light emitting device capable of suppressing a patterning defect caused by a residue of a release layer, the method including: a first organic compound layer formation step; a first protective layer formation step; a second protective layer formation step; a second protective layer processing step; a first protective layer processing step; a first organic compound layer processing step; a second organic compound layer formation step; and a lift-off step in which the pattern of the second protective layer obtained in the second protective layer processing step is formed also in a second region.

8 Claims, 8 Drawing Sheets

METHOD OF MANUFACTURING ORGANIC LIGHT EMITTING DEVICE

BACKGROUND OF THE INVENTION

1. Field of the Invention

The present invention relates to a method of manufacturing an organic light emitting device.

2. Description of the Related Art

As a method of patterning an organic compound layer including an emission layer constituting an organic light emitting element, in recent years, a method using photolithography has drawn attention because the method is capable of performing high-precision patterning compared with other patterning procedures such as those using a metal mask.

For example, Japanese Patent No. 4578026 discloses a method of patterning an organic compound layer through use of photolithography. In Japanese Patent No. 4578026, specifically, a light emitting device including multiple organic electroluminescent elements is manufactured in accordance with a method described below. First, a thin film layer to be a first emission layer insoluble in a photoresist material is formed on a base, a photoresist layer is formed on the thin film layer, and then, the photoresist layer is patterned so that the photoresist layer remains in a portion in which a first light emitting portion is to be formed. Next, after the thin film layer provided in an area where the photoresist layer does not remain is removed, a second emission layer is formed on the base having the first emission layer and the photoresist layer remaining on the surface of the first emission layer. After that, release agent is brought into contact with the remaining photoresist layer to peel the photoresist layer together with the second emission layer formed on the photoresist layer. Accordingly, the first light emitting portion and a second light emitting portion formed in an intended pattern shape are obtained.

Japanese Patent No. 4544811 also describes a manufacturing process substantially similar to that of Japanese Patent No. 4578026. Further, Japanese Patent No. 4544811 discloses that a release layer is provided between an organic compound layer and a resist layer. Herein, the release layer refers to a layer to be provided so as to peel a member such as a photoresist layer easily, and, in particular, the release layer is used in the case where it is difficult to peel a member such as a photoresist layer from an organic compound layer including an emission layer.

In a process of peeling a patterned photoresist layer from an organic compound layer directly or through use of a release layer as in Japanese Patent Nos. 4578026 and 4544811, a method of dissolving and peeling a constituent material of a predetermined layer through use of a solution for dissolving the constituent material is employed. Specifically, a photoresist layer and a release layer are brought into contact with a solution (release agent) for dissolving the photoresist layer and the release layer to dissolve the photoresist layer and the release layer. In this case, as the release agent, liquid for selectively dissolving the photoresist layer or the release layer (hereinafter collectively referred to as "release layer") is used. In this case, it is necessary to allow the solution to sufficiently permeate the release layer. However, there is a problem in that a layer to be formed on the release layer has a low solution rate with respect to the release agent, and hence the release agent does not easily permeate the release layer from an upper portion thereof. Therefore, the release agent permeates the release layer from an end portion thereof. In the case where an area to be peeled is large, the solution does not sufficiently permeate the release layer, and as a result, there arises a problem in that a residue of the release layer is formed.

In general, the release layer is patterned by forming, on the release layer, a mask pattern with a layer capable of forming a pattern through photolithography. In this case, the layer capable of forming a pattern through photolithography refers to a layer which is formed of at least one layer and exhibits resistance during pattern formation of the release layer.

Although Japanese Patent Nos. 4578026 and 4544811 do not particularly mention a specific pattern shape of the organic compound layer, it can be thought that the pattern shape of the organic compound layer depends on a pattern shape of the release layer. The release layer provided in a light emitting region is generally patterned to a size of several μm to hundreds of μm although depending on the screen size, and hence, the release agent permeates the entire release layer sufficiently from an end portion of each pattern. In contrast, a portion other than the light emitting region has no or less minute patterns described above. Therefore, even when an attempt is made to allow the release agent to permeate the release layer from an end portion of a pattern, the release agent does not permeate a pattern center portion of the release layer easily, and the release layer cannot be peeled sufficiently, with the result that a residue may be formed. For example, when a residue of the release layer connecting the outside to the light emitting region is formed in the case where an encapsulation member or an encapsulation film for encapsulating the light emitting region from the outside is provided, the residue functions as a water intrusion path, which causes an encapsulation defect.

SUMMARY OF THE INVENTION

The present invention has been made so as to solve the above-mentioned problems, and it is an object of the present invention to provide a method of manufacturing an organic light emitting device capable of suppressing an encapsulation defect caused by a residue of a release layer.

According to an exemplary embodiment of the present invention, there is provided a method of manufacturing an organic light emitting device, the organic light emitting device including: a substrate on which a first region and a second region are provided, the first region being a light emitting region having multiple light emitting portions, the second region being provided on a periphery of the first region; and first electrodes formed respectively in areas corresponding to the multiple light emitting portions, the method including: a first organic compound layer formation step of forming a first organic compound layer including a first emission layer at least in the first region; a first protective layer formation step of forming a first protective layer including a release layer over an entire surface of the substrate on which the first organic compound layer is formed; a second protective layer formation step of forming a second protective layer on the first protective layer; a second protective layer processing step of removing a part of the second protective layer to obtain a patterned second protective layer; a first protective layer and first organic compound layer processing step of removing a part of the first protective layer and the first organic compound layer in accordance with a pattern of the second protective layer to obtain a patterned first protective layer and a patterned first organic compound layer; a second organic compound layer formation step of forming a second organic compound layer including a second emission layer over an entire surface of the substrate on which the patterned first organic compound layer is formed; and a lift-off step of bringing the release layer into contact with release agent for selectively removing the release layer, to thereby remove at least the release layer together with a layer formed above the release layer, in which an area from which the second protective layer is removed in the second protective layer processing step is provided also in the second region, and in which a minimum value of an interval between areas from which the second protective layer is removed in the second region is 100 times or less a minimum value of an interval between areas from which the second protective layer is removed in the first region.

According to the present invention, there can be provided the method of manufacturing an organic light emitting device capable of suppressing a patterning defect caused by a residue of the release layer, and encapsulating with high reliability.

That is, according to the present invention, by removing a part of the second protective layer formed on the first protective layer at a predetermined interval in a region surrounding the light emitting region, the release agent permeates sufficiently to dissolve the release layer included in the first protective layer. Therefore, an area in which a residue of a layer above the release layer is not formed can be formed to surround the light emitting region, and satisfactory encapsulation can be performed.

Further features of the present invention will become apparent from the following description of exemplary embodiments with reference to the attached drawings.

BRIEF DESCRIPTION OF THE DRAWINGS

FIG. 1A is a plan view; and FIG. 1B is a view illustrating a cross-section taken along the line 1B-1B of FIG. 1A.

FIG. 2A is a plan view; and FIG. 2B is a view illustrating a cross-section taken along the line 2B-2B of FIG. 2A.

FIG. 6A is a view illustrating a processing region of the second protective layer in a γ portion in FIG. 1A; and FIG. 1B is a view illustrating a processing region of the second protective layer in the β portion in FIG. 1A.

DESCRIPTION OF THE EMBODIMENTS

Figure 1A:
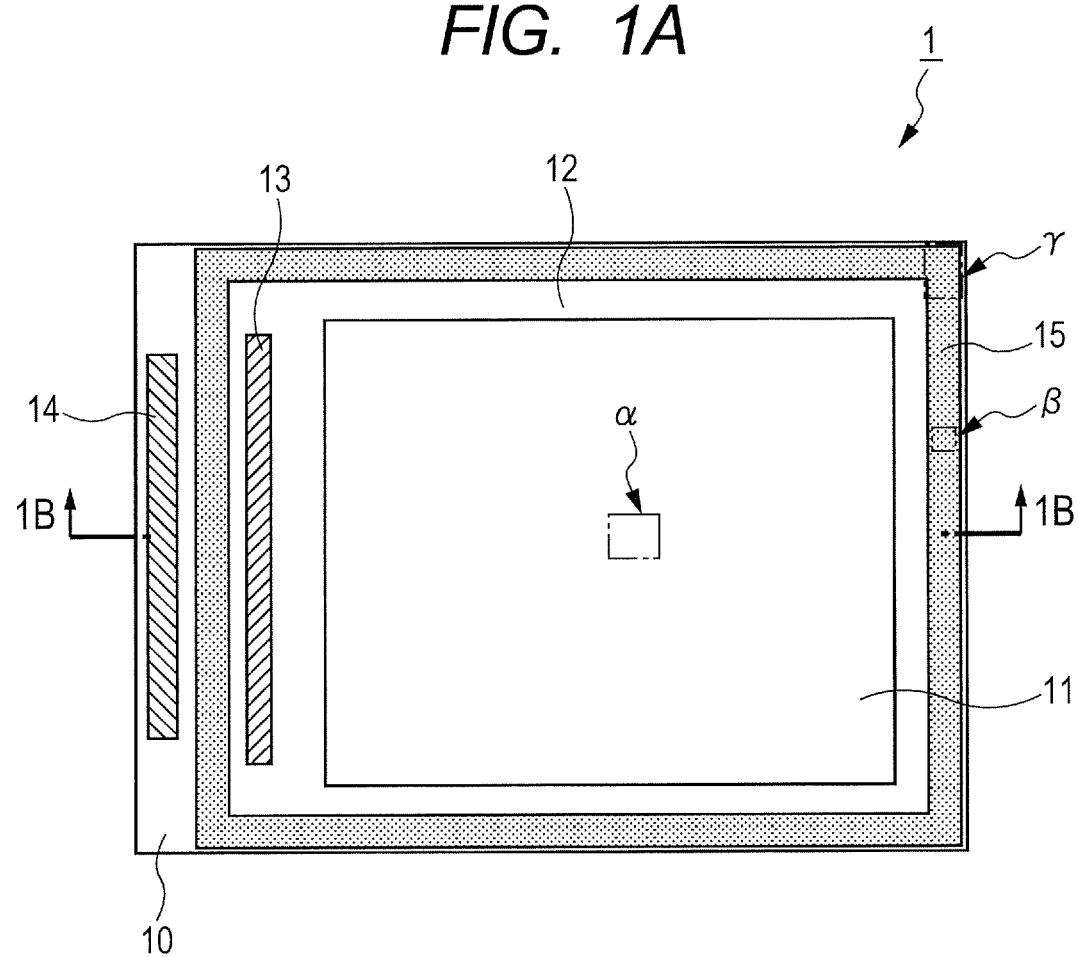
FIGS. 1A and 1B are schematic views illustrating an example of an organic light emitting device manufactured by a manufacturing method of the present invention.

Preferred embodiments of the present invention will now be described in detail in accordance with the accompanying drawings.

The present invention relates to a method of manufacturing an organic light emitting device including a first region and a second region provided on the periphery of the first region on a substrate, the first region being a light emitting region including multiple light emitting portions, the light emitting region having first electrodes formed thereon respectively in areas corresponding to the light emitting portions.

In the present invention, the first region refers to a region for displaying an image, in which multiple light emitting portions are arranged in a flat area on the substrate, and is also referred to as a light emitting region. Further, the second region refers to a region other than the light emitting region in the flat area on the substrate and generally corresponds to a region on the periphery of the first region (light emitting region). In the second region, a drive circuit, an electrode contact portion, flexible printed circuit (FPC) connecting portions, an encapsulation portion, and the like are formed.

The manufacturing method of the present invention includes the following steps (A) to (H):

(A) a first organic compound layer formation step of forming a first organic compound layer including at least a first emission layer;

(B) a first protective layer formation step of forming a first protective layer including at least a release layer on the first organic compound layer;

(C) a second protective layer formation step of forming a second protective layer on the first protective layer;

(D) a second protective layer processing step of removing a part of the second protective layer to obtain a patterned second protective layer;

(E) a first protective layer processing step of removing a part of the first protective layer in accordance with the pattern of the second protective layer to obtain a patterned first protective layer;

(F) a first organic compound layer processing step of removing a part of the first organic compound layer in accordance with the pattern of the second protective layer to obtain a patterned first organic compound layer;

(G) a second organic compound layer formation step of forming a second organic compound layer including a second emission layer at least on the first organic compound layer; and (H) a lift-off step of bringing the first protective layer into contact with release agent for selectively removing the first protective layer to remove at least the first protective layer and the second protective layer and the second organic compound layer formed on the first protective layer.

The step (E) and the step (F) may be made in one step in which the step (E) and the step (F) are continuously performed.

The first protective layer formed in the step (B) includes at least the release layer to be removed from the substrate when the release layer is brought into contact with the release agent used in the step (H).

The second protective layer formed in the step (C) protects layers formed below the second protective layer (first protective layer, first organic compound layer, and the like) and is provided so as to process these layers into a desired pattern shape. Therefore, when the layers formed below the second protective layer are processed, it is necessary to form a pattern of the second protective layer in advance in accordance with an intended pattern shape of the first organic compound layer. An example of a method of patterning the second protective layer is photolithography utilizing a photosensitive material. However, the present invention is not limited thereto. A specific procedure of patterning is to be described later.

Further, in the present invention, the step of forming a single layer having a function of the first protective layer and a function of the second protective layer may be included in place of the steps (B) and (C).

The second organic compound layer formed in the step (G) is a single layer or a laminate formed of multiple layers, at least including the second emission layer different from the first emission layer. Herein, the "second emission layer different from the first emission layer" refers to an emission layer different from the first emission layer in at least one of a material, a composition, and a thickness of the emission layer, a film forming method for forming the emission layer, and a film forming condition.

Further, in the present invention, an area in which the second protective layer obtained by the processing step of the second protective layer described in the above-mentioned step (D) is removed is formed in the second region so as to surround the first region.

The steps (A) to (H) are to be described in detail later.

Next, an organic light emitting device manufactured by the manufacturing method of the present invention is described in detail with reference to the drawings. Note that, a well-known or known technology in the technical field can be applied particularly to portions which are not illustrated in the drawings or described in this specification. Further, the embodiments described below are merely examples of the method of manufacturing a light emitting device according to the present invention, and the present invention is not limited to these embodiments.

(Organic Light Emitting Device)

Figure 1B:
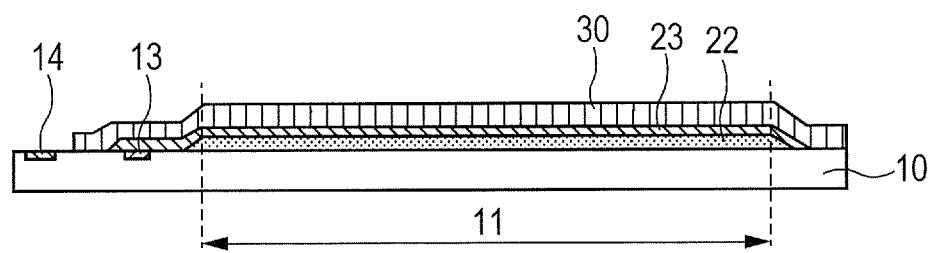
Figure 2A:
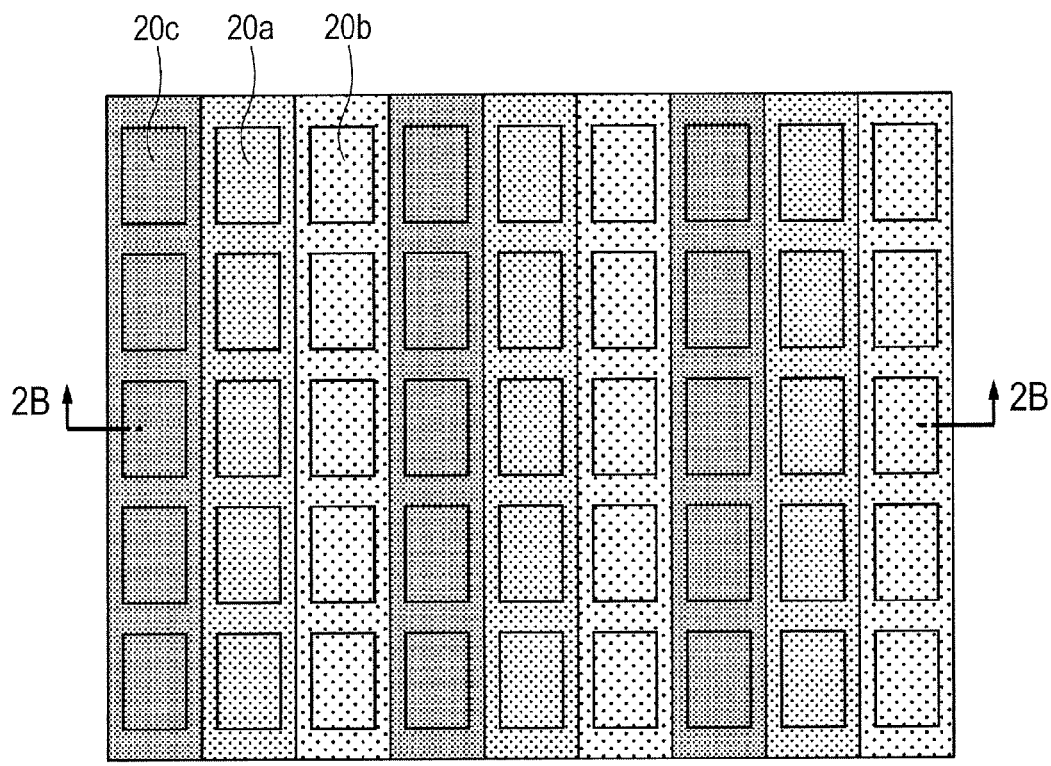
FIGS. 2A and 2B are schematic views illustrating an α portion of FIG. 1A.
Figure 2B:
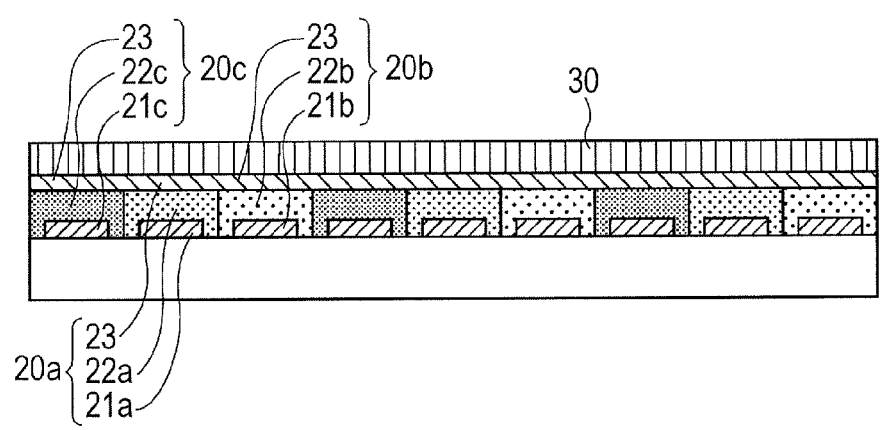

FIGS. 1A and 1B are schematic views illustrating an example of an organic light emitting device produced by the manufacturing method of the present invention. FIG. 1A is a plan view, and FIG. 1B is a view illustrating a cross-section taken along the line 1B-1B of FIG. 1A. FIGS. 2A and 2B are schematic views illustrating an enclosed portion ($\alpha$ portion) of FIG. 1A. FIG. 2A is a plan view, and FIG. 2B is a view illustrating a cross-section taken along the line 2B-2B of FIG. 2A. The enclosed portion $\alpha$ in FIG. 1A corresponds to a light emitting region of the organic light emitting device of FIGS. 1A and 1B.

An organic light emitting device 1 of FIGS. 1A and 1B includes a first region 11 (light emitting region) and a second region 12 provided on the periphery of the first region 11 on a substrate 10. In this case, the first region 11 is also a region in which multiple organic light emitting elements are provided as described later. Further, the organic light emitting device 1 of FIGS. 1A and 1B includes, in the second region 12, an external connecting terminal 14 for receiving supply of electric power and a signal from outside, and a contact portion 13 for electrically connecting second electrodes which are constituent members of the organic light emitting elements to wiring (not shown) connected to the external connecting terminal 14. Note that, in the organic light emitting device 1 of FIGS. 1A and 1B, the contact portion 13 is provided so as to be covered with an encapsulation member.

For example, as illustrated in FIGS. 2A and 2B, in the first region 11 (light emitting region) of the organic light emitting device 1 of FIGS. 1A and 1B, three kinds of organic light emitting elements (first organic light emitting elements 20a, second organic light emitting elements 20b, third organic light emitting elements 20c) of different emission colors are provided in matrix. The first organic light emitting element 20a illustrated in FIGS. 2A and 2B is an electronic element in which a first electrode 21a, a first organic compound layer 22a, and a second electrode 23 are provided on the substrate 10 in this order. The second organic light emitting element 20b is an electronic element in which a first electrode 21b, a second organic compound layer 22b, and the second electrode 23 are provided on the substrate 10 in this order. The third organic light emitting element 20c is an electronic element in which a first electrode 21c, a third organic compound layer 22c, and the second electrode 23 are provided on the substrate 10 in this order. Further, the organic light emitting elements (20a, 20b, and 20c) are covered and encapsulated with an encapsulation member 30 in upper portions.

In the organic light emitting elements (20a, 20b, and 20c) illustrated in FIGS. 2A and 2B, the first electrodes (21a, 21b, and 21c) corresponding to lower electrodes are formed on the substrate 10 separately on the element basis and in matrix in a planar view. Note that, the first electrodes may be formed as an electrode common to the multiple organic light emitting elements. This enables the multiple organic light emitting elements having the first electrode in common to emit light simultaneously and output light of color obtained by mixing multiple kinds of light beams emitted by the respective light emitting elements. Further, the first electrodes (21a, 21b, and 21c) are electrically connected to a circuit layer (not shown) embedded in the substrate 10.

In the organic light emitting elements (20a, 20b, and 20c) illustrated in FIGS. 2A and 2B, the emission layers (first emission layer, second emission layer, third emission layer) of the respective organic light emitting elements emit light of different colors. For example, by forming the first emission layer, the second emission layer, and the third emission layer as a red emission layer (R emission layer), a green emission layer (G emission layer), and a blue emission layer (B emission layer) in this order, a full-color display can be performed.

Further, in the organic light emitting elements (20a, 20b, and 20c) illustrated in FIGS. 2A and 2B, the second electrode 23 corresponding to the upper electrode is a common layer formed as a layer common to the respective organic light emitting elements (20a, 20b, and 20c). However, the present invention is not limited to this embodiment. For example, the second electrode 23 may be formed individually for the organic light emitting elements (20a, 20b, and 20c).

Organic materials constituting the organic compound layers (22a, 22b, and 22c) are remarkably degraded by water and oxygen. Therefore, in order to prevent water from intruding into the light emitting region 11 from outside, the encapsulation member 30 is provided so as to cover the organic light emitting elements (20a, 20b, and 20c).

In the organic light emitting device 1 of FIGS. 1A and 1B, the encapsulation member 30 is provided so as to cover the light emitting region 11. When the encapsulation member 30 is provided, in order to shut off the water intrusion path to the organic light emitting elements, it is necessary to remove at least a part of the organic compound layers formed on the periphery of the first region 11 (light emitting region) on the substrate 10, that is, in a predetermined region in the second region 12. The predetermined region specifically refers to a region 15 in FIGS. 1A and 1B. The region 15 is provided so as to surround the light emitting region 11 in order to shut off water intruding from outside into the light emitting region 11 covered with the encapsulation member 30, and has a configuration in which water hardly permeates at least in a part.

Although the encapsulation member 30 illustrated in FIGS. 1A and 1B is a member in a thin film shape formed of a material having high moisture resistance, the present invention is not limited thereto. Intrusion of water from outside may be prevented by fixing a glass cap or the like to the substrate 10 through use of an adhesive having low moisture permeability in place of the encapsulation member 30 having a thin film shape illustrated in FIGS. 1A and 1B. In this case, it is preferred that the adhesive used for fixing the glass cap or the like to the substrate 10 be provided outside the region 15. When the adhesive overlaps the region 15, it is desired that the adhesive be applied so as not to bury the region 15.

(Method of Manufacturing Organic Light Emitting Device)

Next, the method of manufacturing an organic light emitting device according to the present invention is described. The manufacturing method of the present invention includes the following steps (A) to (H):

(A) a first organic compound layer formation step of forming a first organic compound layer including at least a first emission layer;

(B) a first protective layer formation step of forming a first protective layer including at least a release layer on the first organic compound layer;

(C) a second protective layer formation step of forming a second protective layer on the first protective layer;

(D) a second protective layer processing step of removing a part of the second protective layer to obtain a patterned second protective layer;

(E) a first protective layer processing step of removing a part of the first protective layer in accordance with the pattern of the second protective layer to obtain a patterned first protective layer;

(F) a first organic compound layer processing step of removing a part of the first organic compound layer in accordance with the pattern of the second protective layer to obtain a patterned first organic compound layer;

(G) a second organic compound layer formation step of forming a second organic compound layer including a second emission layer at least on the first organic compound layer; and (H) a lift-off step of bringing the first protective layer into contact with release agent for selectively removing the first protective layer to remove at least the first protective layer and the second protective layer and the second organic compound layer formed on the first protective layer.

First Embodiment

Figure 3A:
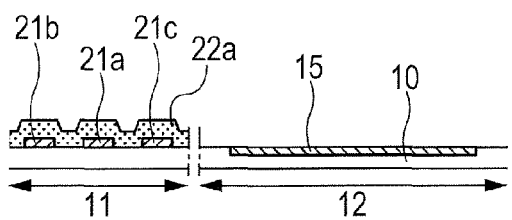
FIGS. 3A, 3B, 3C, 3D, 3E, 3F, 3G, 3H, 3I, 3J, 3K, 3L, 3M, and 3N are schematic cross-sectional views illustrating a method of manufacturing an organic light emitting device according to a first embodiment of the present invention.
Figure 3E:
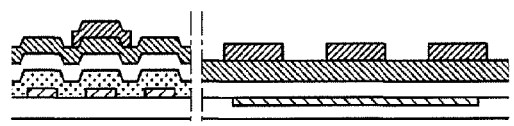
Figure 3B:
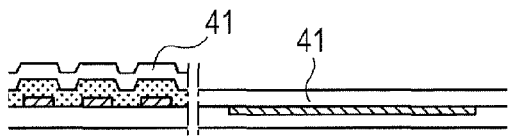
Figure 3F:
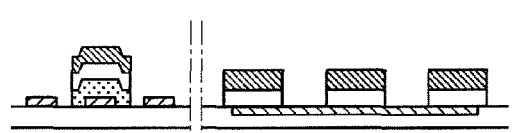
Figure 3C:
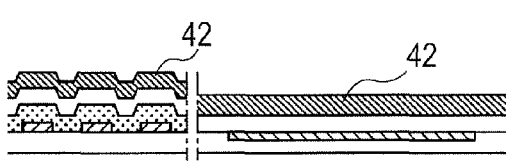
Figure 3G:
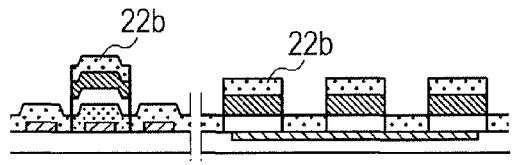
Figure 3D:
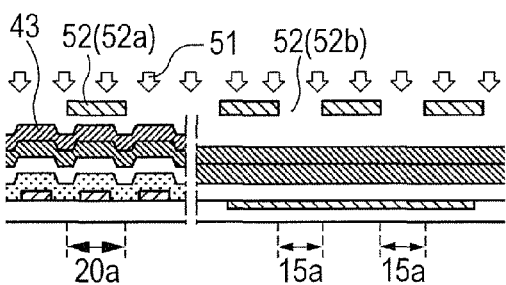
Figure 3H:
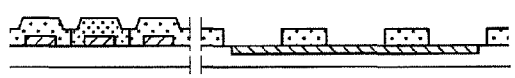
Figure 3I:
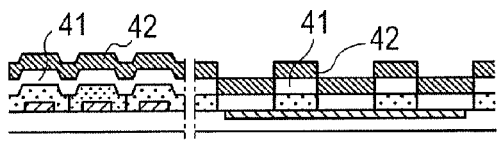
Figure 3L:
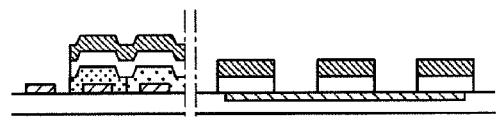
Figure 3J:
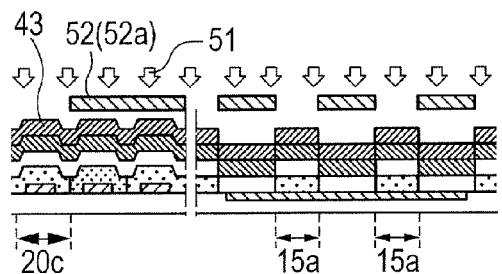
Figure 3M:
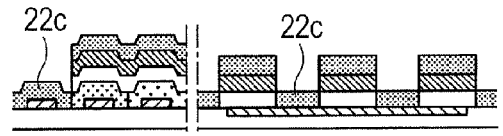
Figure 3K:
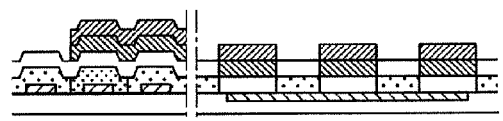
Figure 3N:
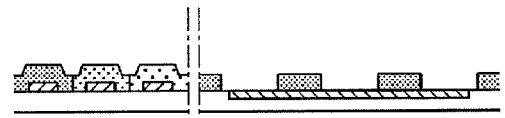

FIGS. 3A to 3N are schematic cross-sectional views illustrating a method of manufacturing an organic light emitting device according to a first embodiment of the present invention. Each step is hereinafter described based on a manufacturing process illustrated in FIGS. 3A to 3N. The manufacturing process illustrated in FIGS. 3A to 3N is a manufacturing process for manufacturing the organic light emitting device 1 of FIGS. 1A and 1B.

(1) Substrate Including Electrodes

First, a substrate to be used in the manufacturing process illustrated in FIGS. 3A to 3N is described. As illustrated in FIG. 3A, the substrate 10 has multiple first electrodes (21a, 21b, and 21c) provided in advance in regions corresponding to light emitting portions.

The substrate 10 may or may not be transparent. Specifically, examples of the substrate 10 include an insulating substrate made of glass, a synthetic resin, or the like, and a conductive substrate or a semiconductor substrate on which a thin film made of an insulating material such as a silicon oxide ($SiO_2$) film, a silicon nitride (SiN) film, or a silicon oxynitride (SiON) film is formed on the front surface. In the case of manufacturing a bottom emission type organic light emitting device, a transparent substrate is used as the substrate 10.

Further, in the substrate 10, if required, a drive circuit (not shown) including transistors (TFTs), a planarization layer (not shown), a pixel separation layer (not shown), and the like may be provided appropriately. In the case where the substrate 10 includes a drive circuit, a TFT included in the drive circuit is formed of, for example, a semiconductor layer made of polysilicon. However, the present invention is not limited thereto, and the TFT may be a member formed through use of amorphous silicon, microcrystalline silicon, or the like.

The planarization layer is provided so as to fill unevenness formed when the drive circuit including TFTs is formed. The planarization layer is made of an insulating material. Specifically, the planarization layer is made of an organic material such as photosensitive polyimide, or an inorganic material such as silicon oxide ($SiO_2$), silicon nitride (SiN), or silicon oxynitride (SiON).

As illustrated in FIG. 3A, in a first region 11 corresponding to a light emitting region, multiple first electrodes (21a, 21b, and 21c) to be pixel electrodes are provided. In the case of manufacturing a top emission type organic light emitting device, it is preferred that the first electrodes (21a, 21b, and 21c) be made of, for example, a light-reflective material such as a metal having a high reflectance such as Al, Ag, Au, Pt, or Cr, and an alloy formed by combining at least two kinds of these metals. Although the first electrodes (21a, 21b, and 21c) may be formed as a layer made of the above-mentioned light-reflective material, the present invention is not limited thereto. For example, the first electrodes (21a, 21b, and 21c) may be a laminate of a layer made of the above-mentioned light-reflective material and a layer made of a transparent conductive material such as ITO or IZO provided on the layer. In the case of manufacturing a bottom emission type organic light emitting device, the first electrodes (21a, 21b, and 21c) are formed of a transparent conductive material. The first electrodes (21a, 21b, and 21c) may be electrodes to be an anode or a cathode. In the case where the first electrodes (21a, 21b, and 21c) are used as an anode, it is preferred that the first electrodes (21a, 21b, and 21c) be made of a constituent material having a large work function so that holes are injected easily.

When the first electrodes (21a, 21b, and 21c) are formed, the first electrodes (21a, 21b, and 21c) are formed in regions corresponding to light emitting portions of respective organic light emitting elements, for example, through the step of forming a conductive layer and the step of processing the conductive layer. In this case, the step of forming a conductive layer is specifically a step of forming a conductive layer over the entire surface of the substrate 10 through use of a vacuum film forming method such as a sputtering method or a vapor deposition method. The step of processing the conductive layer is specifically a step of patterning a conductive layer for each light emitting portion by a known photolithography process such as photolithography.

After forming the first electrodes (21a, 21b, and 21c), an element separation layer for partitioning the respective organic light emitting elements (20a, 20b, and 20c) on an element basis to determine a region to be a light emitting portion may be provided appropriately. The element separation layer is a film made of an insulating material and is formed through use of an organic material such as photosensitive polyimide or an inorganic material such as silicon nitride (SiN). In the case where the element separation layer is provided, the element separation layer is provided with openings at least in areas corresponding to the first electrodes (21a, 21b, and 21c).

On the other hand, as illustrated in FIG. 3A, the region 15 is provided in the second region 12 so as to surround the first region 11. Specifically, the region 15 is a region on the substrate 10, which has, on the outermost surface thereof, a layer made of a water-impermeable material, such as a metal, a metal oxide, or a nitride. Further, in the case of forming a water-impermeable encapsulation layer (30 of FIG. 2B) as an encapsulation member in a later step, the region 15 becomes a region in which the encapsulation layer 30 and the layer made of a water-impermeable material come into contact with each other so as to surround the first region 11. In the case of performing encapsulation by bonding an encapsulation member such as a cap glass onto the substrate 10, a bonding region (region to which an adhesive for encapsulation is applied) between the encapsulation member and the substrate 10 is provided on the periphery of the region 15.

(2) Step of Forming Organic Compound Layer (FIG. 3A)

In the manufacturing process illustrated in FIGS. 3A to 3N, first, on the substrate 10 on which the first electrodes (21a, 21b, and 21c) that are lower electrodes are formed, an organic compound layer (first organic compound layer 22a) is formed (FIG. 3A).

The organic compound layer (first organic compound layer 22a) includes at least an emission layer, and may include multiple functional layers such as a hole injection layer, a hole transport layer, a hole blocking layer, an electron blocking layer, an electron transport layer, and an electron injection layer in addition to the emission layer if necessary. Further, by setting the thickness of the organic compound layer (first organic compound layer 22a) to an optical interference distance of a particular wavelength, a light emitting element can also emit light with a particular wavelength efficiently. In the case of determining the thickness of the organic compound layer depending on the optical interference distance, the thickness of the organic compound layer may be set so as to vary depending on the kinds of the organic light emitting elements because colors of light beams emitted from organic light emitting elements vary depending on the kinds of the organic light emitting elements. The thickness of the organic compound layer (first organic compound layer 22a) is generally tens of nm to hundreds of nm.

As the constituent material of the emission layer included in each organic light emitting element, a low molecular weight material or a high molecular weight material may be used. Further, when an emission layer is formed, a known method such as a vacuum vapor deposition method, or a coating method such as a spin coating method or an ink-jet method can be selected appropriately depending on the material and the application. In general, in the case of using a low molecular weight material, a vacuum vapor deposition method or the like is used, and, in the case of using a high molecular weight material, a coating method using a spin coating method or an ink-jet method is used.

As the low molecular weight material to be used as the constituent material of the emission layer, there may be used a triarylamine derivative, a stilbene derivative, polyarylene, an aromatic condensed polycyclic compound, an aromatic heterocyclic compound, an aromatic condensed heterocyclic compound, a metal complex compound, and a single oligomer or complex oligomer thereof. However, the material for a part which is not concerning the present invention is not limited to those materials.

As a high molecular weight material to be used as the constituent material of the emission layer, there may be used a polyparaphenylene vinylene derivative, a polythiophene derivative, a polyparaphenylene derivative, a polysilane derivative, a polyacethylene derivative, a polyfluorene derivative, a polyvinyl carbazole derivative, and polymers of the above-mentioned low molecular weight materials. However, the material for a part which is not concerning the present invention is not limited to those materials. Further, those materials are not limited to those illustrated as a constitution of the present invention.

Further, in the case where the first organic compound layer 22a formed in FIG. 3A is a laminate including an emission layer and functional layers other than the emission layer, a method similar to that of forming an emission layer can be adopted as a method of forming the functional layers. Further, as constituent materials for the functional layers, a known material can be used. All or a part of the functional layers other than the emission layer may be formed as layers common to all the organic light emitting elements.

In this embodiment, the first organic compound layer 22a is formed only in the first region 11 through use of an area mask and is not formed in the second region 12 including the region 15. Note that, in the present invention, the region in which the first organic compound layer 22a is provided is not limited to the first region 11.

(3) Step of Processing First Organic Compound Layer

Next, the first organic compound layer 22a is processed into a desired pattern. When the first organic compound layer 22a is processed through use of photolithography, first, a resist layer is formed on the first organic compound layer 22a, and a predetermined area of the resist layer is irradiated with light. Then, development is performed to form a patterned resist layer. Dry etching is performed along the pattern of the resist layer to form the patterned first organic compound layer 22a.

In this case, when the constituent material of the first organic compound layer 22a is a material which is not dissolved or hardly dissolved in a solvent contained in resist liquid to be used for forming a resist layer, a resist layer may be provided directly on the first organic compound layer 22a. The same also applies to the case in which resist liquid containing a solvent which does not dissolve the constituent material of the first organic compound layer 22a can be selected.

On the other hand, in the case where the constituent material of the first organic compound layer 22a is a material which is dissolved in a solvent contained in resist liquid, a member (protective layer) for protecting the first organic compound layer 22a is formed on the first organic compound layer 22a before a resist layer is provided. In the case where it is necessary to form a protective layer on the first organic compound layer 22a, specifically, this step (step of processing the first organic compound layer 22a) includes the following steps:

(3-1) the step of forming a first protective layer 41 (FIG. 3B);

(3-2) the step of forming a second protective layer 42 (FIG. 3C);

(3-3) the step of forming a resist layer 43 (FIG. 3D);

(3-4) the exposure step (FIG. 3D);

(3-5) the developing step (FIG. 3E);

(3-6) the step of processing the second protective layer 42;

(3-7) the step of processing the first protective layer 41; and (3-8) the step of partially removing the first organic compound layer 22a (FIG. 3F).

The steps (3-1) to (3-7) are merely specific examples, and a part of the steps may be omitted depending on the constituent materials of the first organic compound layer 22a and the first protective layer 41. For example, in the case where a resist layer is provided directly on the first organic compound layer 22a, the steps (3-1), (3-2), (3-6), and (3-7) can be omitted. Further, when the steps (3-3) to (3-5) are performed, the steps (3-2) and (3-6) can also be omitted under a condition of using the resist layer as the second protective layer as long as damages to the first protective layer are allowable, that is, as long as the function as the first protective layer is not lost. In this case, examples of the damages to the first protective layer include physical damages caused by heat treatment performed in the step (3-3), exposure performed in the step (3-4), and the like, and chemical damages caused by resist liquid to be used in the step (3-3), a developer to be used in the step (3-5), and the like. Further, pattern precision may vary depending on a side etching amount or the like during patterning, and hence, it is necessary to determine the steps to be performed in view of the above-mentioned points.

The case of processing the first organic compound layer 22a through the steps (3-1) to (3-7) is hereinafter described.

(3-1) Step of Forming First Protective Layer (FIG. 3B)

First, the first protective layer 41 is formed on the first organic compound layer 22a. The first protective layer 41 formed in this step is a member to be used for forming a pattern of the first organic compound layer 22a and includes at least a release layer. For example, the first protective layer 41 may include a layer for removing a residue of the release layer between the release layer and the first organic compound layer 22a. The release layer is a layer which is selectively dissolved in predetermined release agent, and is a layer provided so as to easily remove a layer formed above the release layer, for example, the second protective layer 42 (described later) from the first organic compound layer 22a. Further, the release layer is a layer made of a material having high solubility with respect to a solvent which hardly dissolves the constituent materials of the first organic compound layer 22a. Considering that most of the constituent materials of the first organic compound layer 22a are water-insoluble organic materials, it is preferred that the constituent material of the release layer be a water-soluble polymer material. Note that, in the present invention, the constituent material of the release layer is not limited to a water-soluble polymer material, and may be a material to be dissolved in water or an inorganic salt aqueous solution.

As the water-soluble polymer material to be used as the constituent material of the release layer, there may be used, for example, polyvinyl alcohol (PVA), a polyacrylic acid-based polymer, polyethylene glycol (PEG), polyethylene oxide (PEO), polyvinylpyrrolidone (PVP), and other publicly known materials. In the case of forming the release layer through use of these water-soluble polymer materials, a known method such as a coating method or a printing method can be used.

Further, as release agent to be used for removing the first protective layer 41 in the step of removing the first protective layer 41 to be described later, liquid which does not dissolve or hardly dissolve the constituent material of the first organic compound layer 22a is used. From the viewpoint of relative solubility (solubility of the first protective layer 41 is 1) to release agent based on the first protective layer 41, the solubility of the first organic compound layer 22a to the release agent is preferably 1/10 or less, more preferably 1/50 or less.

The first protective layer 41 may be formed only of the above-mentioned release layer or may have a configuration in which other layers are further laminated on the release layer. Further, the first protective layer 41 is formed not only in the first region 11 but also in the second region 12 including the region 15, as illustrated in FIG. 3B.

(3-2) Step of Forming Second Protective Layer (FIG. 3C)

Next, the second protective layer 42 is formed on the first protective layer 41. As the constituent material of the second protective layer 42, for example, a material capable of protecting the release layer (first protective layer 41) and the organic compound layer (first organic compound layer 22a) from a wet step such as a photolithography step using a resist material is preferred. For example, known inorganic materials such as a silicon oxide ($SiO_2$) film, a silicon nitride (SiN) film, and a silicon oxynitride (SiON) film can be used. However, the present invention is not limited thereto. Further, the second protective layer 42 also serves to transfer a pattern formed in a resist layer 43 to be described later to underlying layers (first protective layer 41, first organic compound layer 22a).

As illustrated in FIG. 3C, the second protective layer 42 is formed not only in the first region 11 but also in the second region 12 including the region 15.

(3-3) Step of Forming Resist Layer

Next, the second protective layer 42 is coated with a resist material to form the resist layer 43. As a resist material to be used in this step, a known resist material (photosensitive material) can be used. Further, as a method for forming the resist layer 43, a known method such as a spin coating method, a slit coating method, a dipping method, or a spray coating method can be selected.

As illustrated in FIG. 3D, the resist layer 43 is formed not only in the first region 11 but also in the second region 12 including the region 15.

(3-4) Exposure Step (FIG. 3D)

Next, predetermined areas of the resist layer 43 are irradiated with light 51 (FIG. 3D). Examples of an exposure device to be used in this step include an MPA and a stepper. Further, when the predetermined areas are irradiated with the light 51 in this step, a photomask 52 provided with spieling portions 52a in predetermined areas is used. Although the photomask 52 illustrated in FIG. 3D includes the shielding portions 52a in areas in which the first organic light emitting elements 20a are provided and in a partial area within the second region 12, the areas for providing the shielding portions 52a are not limited thereto in the present invention. On the other hand, the photomask 52 to be used in this step is provided with openings 52b in predetermined areas (15a) in the region 15.

(3-5) Developing Step (FIG. 3E)

Next, the resist layer in areas irradiated with the light 51 in the exposure step is selectively removed through use of a developer (FIG. 3E). A known developer can be used as the one to be used in this step.

(3-6) Step of Processing Second Protective Layer

Next, the second protective layer 42 is processed by dry etching using chemically reactive etching gas such as $CF_4$ through use of the resist layer 43 remaining after the developing step as a mask. As the method of dry etching, a physical etching method using argon gas, an asking method using oxygen, or the like may be adopted depending on the material of the second protective layer 42. This dry etching selectively removes the second protective layer 42 provided in areas not covered with the remaining resist layer 43. When dry etching is used for processing the second protective layer 42, it is possible to remove a thin film substantially perpendicularly to the substrate 10. Therefore, an inclined angle of an end of the processed (patterned) first organic compound layer 22a becomes close to 90°. As a result, when dry etching is used, patterning with precision higher than that of the other methods can be realized.

In this step, the second protective layer 42 to be formed in the second region 12 is also partially processed. In this case, in the first region 11 to be a light emitting region, the organic compound layers (first organic compound layer 22a, and the like) are patterned substantially on a pixel width basis, and hence, a path for permeation of release agent is ensured on a pixel width basis. In contrast, conventionally, in the second region 12 outside of the light emitting region, fine patterning of the organic compound layers (first organic compound layer 22a, and the like) is not performed unlike the first region 11. However, in order to allow release agent to permeate into the second region 12 including the region 15, it is necessary to remove the second protective layer 42 provided in predetermined areas (15a of FIG. 3D) of the second region 12 to ensure a path for permeation of release agent at least into the region 15.

Figure 4:
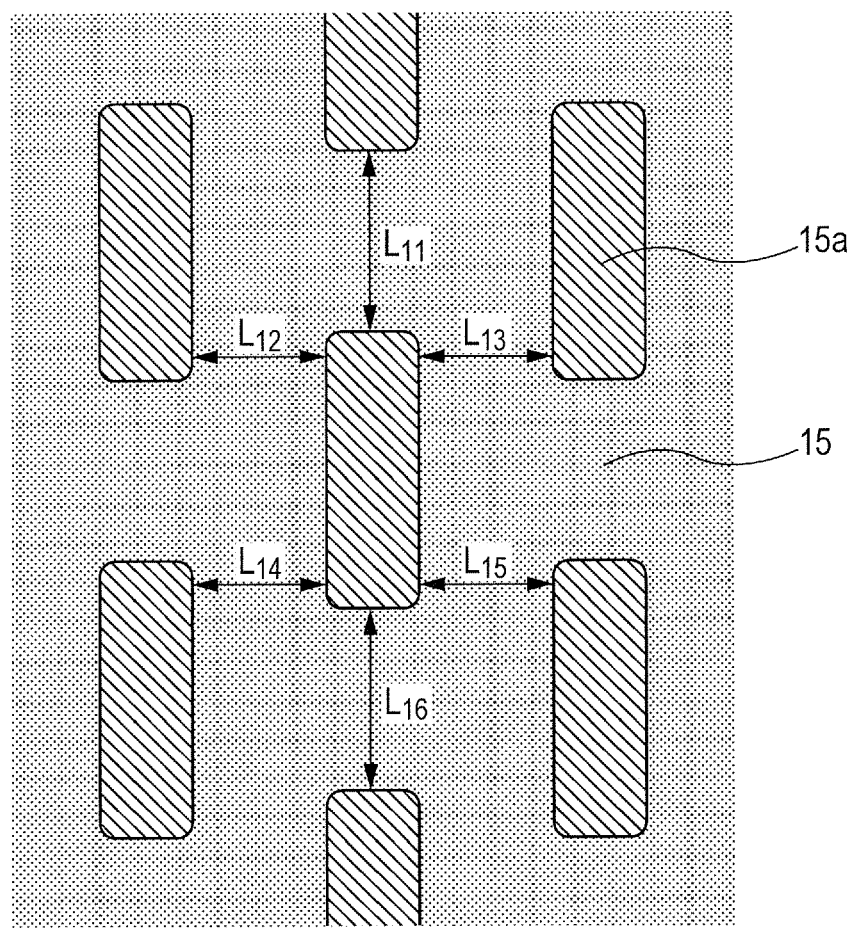
FIG. 4 is a schematic plan view illustrating an example of a pattern of a second protective layer formed in a β portion in FIG. 1A.

An embodiment of processing the second protective layer 42 to be formed in the second region 12 is described with reference to the drawings. FIG. 4 is a schematic plan view illustrating an example of a pattern of the second protective layer 42 to be formed in an enclosed portion (β portion) of FIG. 1A. The β portion of FIG. 1A is an area included in the region 15.

As an embodiment of processing the second protective layer 42 to be formed at least in the region 15 within the second region 12, as illustrated in FIG. 4, it is preferred that the processing (removal) areas 15a of the second protective layer 42 be provided so as to be dispersed at a predetermined interval in the region 15. By setting a processing region of the second protective layer 42 in this way, release agent to be used in the step of removing the first protective layer to be described later intrudes the first protective layer from the processing region 15a. This makes it particularly easier to peel the first protective layer 41 provided in the region 15, and hence, areas in which a residue of the organic compound which is the constituent material of the first protective layer 41 and the like, which may cause encapsulation defects, is not present are formed continuously in the region 15. Thus, when an encapsulation film or an encapsulation member is provided, the encapsulation film can be formed so as to come into contact with areas in which a residue of the organic compound is not present, and an adhesive for bonding the encapsulation member to outside of the areas in which a residue of the organic compound is not present can be applied, resulting in that image degradation caused by encapsulation defects can be prevented.

(3-7) Step of Processing First Protective Layer

Next, the first protective layer 41 is processed by dry etching using chemically reactive etching gas through use of the second protective layer 42 remaining after the processing step of the second protective layer as a mask. This dry etching removes the resist layer 43 remaining up to the immediately previous step (step of processing the second protective layer), and selectively removes the first protective layer 41 provided in an area not covered with the remaining second protective layer 42. Examples of a procedure of dry etching used in this step include an asking method using oxygen, a method using chemical reactivity of fluorine-based gas, and a physical etching method using argon gas, and the procedure can be appropriately selected depending on the constituent material of the first protective layer 41.

For example, in the case where the second protective layer 42 formed in the second region 12 is processed to the pattern illustrated in FIG. 4, the first protective layer 41 formed in the processing region 15a of the second protective layer 42 is removed also in the second region 12 in this step. Then, release agent permeates into the first protective layer 41 from the processing region 15a of the first protective layer 41, that is, an end face of the release layer to thereby peel the first protective layer 41 and the layers formed on the first protective layer 41. In this case, a distance between the removed regions in the second protective layer 42 required for enabling peeling of the layers above the release layer without any residue from the region 15 is influenced by various factors. Specifically, the distance is influenced by factors such as release agent temperature, a release agent concentration, vibration of release agent at a time of peeling, solubility of the first protective layer with respect to release agent, and the thickness of the first protective layer. In the present invention, it is preferred that the minimum interval of the pattern of the first protective layer 41 be 100 times or less the minimum interval of the pattern of the first protective layer 41 formed in the first region 11. Thus, satisfactory peeling without causing any residue of the first protective layer 41 can be realized.

(3-8) Step of Partially Removing First Organic Compound Layer (FIG. 3F)

Next, the first organic compound layer 22a is processed by dry etching through use of the first protective layer 41 and the second protective layer 42 remaining after the step of processing the first protective layer as a mask (FIG. 3F). This dry etching allows the first organic compound layer 22a to remain only in an area in which the first organic light emitting element 20a is to be provided, and removes the first organic compound layer 22a in the other areas. The dry etching performed in this step may be the same as or different from the dry etching procedure utilized in the step of processing the first protective layer.

The second protective layer 42 is removed together with the underlying first protective layer 41 in the step of removing the first protective layer 41, which is to be described later, and hence, there is no problem even when a residue of the resist layer 43 remains on the second protective layer 42. Note that, if a residue remains on the surface of the first electrodes (21b and 21c) in a stage after this step is finished, the residue has a great effect on the characteristics of the elements. Therefore, in this step, the dry etching is performed until the residue of the first organic compound layer 22a is removed from the surface of the first electrodes (21b and 21c).

(4) Step of Forming Second Organic Compound Layer (FIG. 3G)

Next, the second organic compound layer 22b is formed over the first region 11 and the second region 12 (FIG. 3G). In this step, end faces of the first protective layer 41 (release layer) provided on the first organic compound layer 22a are exposed without being covered with the second protective layer 42 or the second organic compound layer 22b. Therefore, release agent to be used for peeling and removing the first protective layer 41 intrudes easily in the subsequent step. Although it is preferred that the release layer be exposed, even when the release layer is not completely exposed by being partially covered with the second organic compound layer 22b, the thickness of the second organic compound layer 22b covering the end faces of the release layer is small. A thin portion of the second organic compound layer 22b is slightly dissolved in release agent to form a portion in which the release layer is exposed, and a solution can intrude from the portion.

When the second organic compound layer 22b is formed, various production methods including the method utilized for forming the first organic compound layer 22a can be applied. In the case of forming the second organic compound layer 22b by a coating method, it is necessary to satisfy the following requirements (4-1) and (4-2):

(4-1) a solvent to be used in the above-mentioned coating method does not influence the second organic compound layer 22a and the second protective layer 42; and (4-2) the constituent material of the second organic compound layer 22b is not dissolved or is hardly dissolved in release agent to be used for removing the first protective layer 41.

On the other hand, in the case of forming the second organic compound layer 22b by a vacuum vapor deposition method, multiple layers can be continuously vapor-deposited. By forming, as an uppermost layer, a layer which is not dissolved or is hardly dissolved in release agent to be used for removing the first protective layer 41, it is not necessary to consider the above-mentioned requirements (4-1) and (4-2), which increase the choice of materials.

(5) Step of Removing First Protective Layer (FIG. 3H)

Next, the first protective layer 41 remaining in the first region 11 and the second region 12 until the immediately previous step (step of forming the second organic compound layer) is removed by causing release agent to permeate into the first protective layer 41 (FIG. 3H). Specifically, in this step, the first protective layer 41 is soaked in a solvent for selectively dissolving the constituent material of the first protective layer 41 which is a release layer to remove the first protective layer 41. In the case where the constituent material of the first protective layer 41 is, for example, a water-soluble polymer material, a solvent to be used is basically pure water. However, in order to enhance solubility of a solvent with respect to the first protective layer 41, heated pure water, a mixed solvent containing a mixture of pure water and about 10% to 50% organic solvent such as isopropyl alcohol may be used if required. Further, intrusion of a solvent may be promoted through use of an ultrasonic wave or the like.

At a time when this step is finished, a pattern of two kinds of organic compound layers, that is, a pattern of the organic compound layers formed of the first organic compound layer 22a and the second organic compound layer 22b is formed in the first region 11.

On the other hand, at a time when this step is finished, the second organic compound layer 22b patterned in the same way as in the pattern of the second protective layer 42 is formed in the second region 12.

(6) Step of Processing Second Organic Compound Layer

By appropriately repeating the step regarding patterning of the organic compound layers described above (step of processing the first organic compound layer), predetermined patterning of organic compound layers can be performed. For example, as illustrated in FIG. 3H, by performing the following steps in order to process the second organic compound layer 42 after removing the first protective layer 41, the second organic compound layer 22b can be patterned.

(6-1) the step of forming the first protective layer (6-2) the step of forming the second protective layer (FIG. 3I)

(6-3) the step of forming the resist layer (FIG. 3J)

(6-4) the exposure step (FIG. 3J)

(6-5) the developing step (6-6) the step of processing the second protective layer (FIG. 3K)

(6-7) the step of processing the first protective layer (6-8) the step of partially removing the second organic compound layer (FIG. 3L)

The steps (6-1) to (6-8) can be performed by the same method as that utilized in the steps (3-1) to (3-8).

(7) Step of Forming Third Organic Compound Layer

Next, the third organic compound layer 22c is formed over the first region 11 and the second region 12 (FIG. 3M). In this step, end faces of the first protective layer 41 (release layer) provided on the first organic compound layer 22a and the second organic compound layer 22b are exposed without being covered with the second protective layer 42 or the third organic compound layer 22c. Therefore, release agent to be used for peeling and removing the first protective layer 41 intrudes into the end faces easily in the subsequent step. Although it is preferred that the release layer be exposed, even when the release layer is partially covered with the third organic compound layer 22c and is not exposed completely, the thickness of the second organic compound layer 22b covering the end faces of the release layer is small. Herein, a thin portion of the third organic compound layer 22c is slightly dissolved in the release agent to form a portion in which the release layer is exposed, and a solution can intrude from the portion.

When the third organic compound layer 22c is formed, various production methods including the method utilized for forming the first organic compound layer 22a and the second organic compound layer 22b can be applied. Herein, as a specific method of forming the third organic compound layer 22c, a coating method, a vacuum vapor deposition method, or the like can be used in the same way as in the second organic compound layer 22b. Further, the constituent material of the third organic compound layer 22c can be appropriately selected considering a method of forming the third organic compound layer 22c.

(8) Step of Removing First Protective Layer (FIG. 3N)

Next, by allowing the release agent to permeate into the first protective layer 41, the first protective layer 41 remaining in the first region 11 and the second region 12 until the previous step (step of forming the third organic compound layer) is removed (FIG. 3N).

When this step is finished, in the first region 11, a pattern of an organic compound layer formed of three kinds of organic compound layers, that is, the first organic compound layer 22a, the second organic compound layer 22b, and the third organic compound layer 22c is formed.

On the other hand, in the second region 12 at a time when this step is finished, the third organic compound layer 22c is formed in the shape of the area 15a illustrated in FIG. 4. In the step of forming the second organic compound layer 22b, the second organic compound layer 22b at a position other than the above-mentioned pattern position formed in the second region 12 is removed in the step of processing the second organic compound layer 22b (FIG. 3L).

(9) Step of Forming Electron Injection Layer

After the three kinds of organic compound layers (22a, 22b, and 22c) are patterned respectively into intended shapes as described above, functional layers such as an electron injection layer are formed in the first region 11 if necessary.

As the electron injection layer, in order to enhance an electron injection property, an alkali metal or an alkaline earth metal, which has a low work function, a compound thereof, or an organic layer or a metal layer which is doped with any of these metals is used. However, the electron injection material has high reactivity and reacts with water and oxygen in the atmosphere to lose an electron injection property. As a result, when an element is produced using the electron injection material, a voltage increases. Therefore, the electron injection material is not preferred to be used in the step of soaking in a solution as in the present invention. Accordingly, in the present invention, the electron injection layer is formed by removing an organic layer with a solution, followed by drying sufficiently. The electron injection layer involves the following cases: an alkali metal or an alkaline earth metal, or a compound thereof is used as a single-layered thin film of about 0.5 nm to 5 nm; and an organic layer doped with an alkali metal or an alkaline earth metal, or a compound thereof is formed by co-evaporation with an organic material. An alkali metal or an alkaline earth metal, or a compound thereof may be included directly in the upper electrode without using the electron injection layer. In this case, a known method such as co-evaporation of a cathode material such as Ag and a metal having a low work function such as Mg can be used.

(10) Step of Forming Second Electrode

Subsequently, the second electrode 23 which is the upper electrode is formed. As the upper electrode, a transparent conductive film made of ITO or IZO, or a reflective film made of Ag or Al or an alloy including these metals can be used. In general, examples of a method of forming the upper electrode include a vapor deposition method and a sputtering method.

Further, in the case of providing a cathode contact in a display area, as illustrated in FIG. 1A, the contact portion 13 may be provided in a part of an area from which the release layer is removed.

(11) Encapsulation Step

In the present invention, there is no particular limit to encapsulation, and encapsulation may be performed through use of a moisture absorbent and a glass cap. In the case of using a silicon nitride (SiN) film or the like as the encapsulation member 30 (moisture-proofing layer), the thickness of the encapsulation member 30 is set to about 1 μm to 10 μm.

In the present invention, an organic light emitting device is manufactured by the method described above. However, parts other than those concerning the present invention are not limited to the procedure described above in the embodiments, and a known manufacturing method can be adopted.

Second Embodiment

Figure 5A:
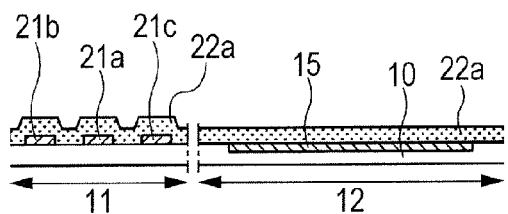
FIGS. 5A, 5B, 5C, 5D, 5E, 5F, 5G, 5H, 5I, 5J, 5K, 5L, 5M, and 5N are schematic cross-sectional views illustrating a method of manufacturing an organic light emitting device according to a second embodiment of the present invention.
Figure 5E:
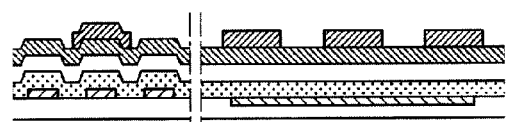
Figure 5B:
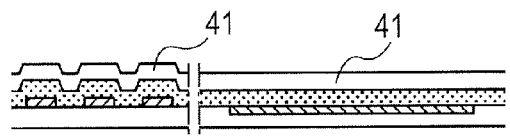
Figure 5F:
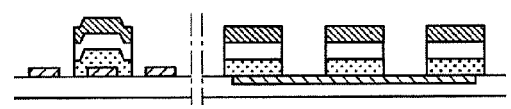
Figure 5C:
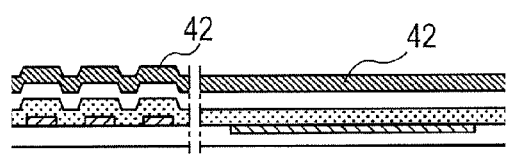
Figure 5G:
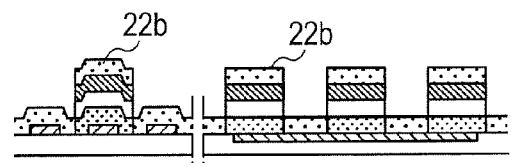
Figure 5D:
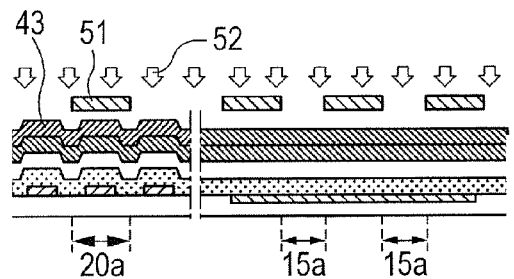
Figure 5H:
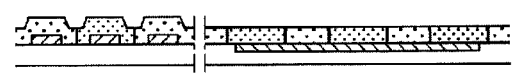
Figure 5I:
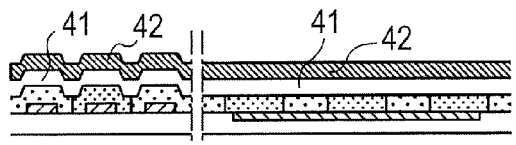
Figure 5L:
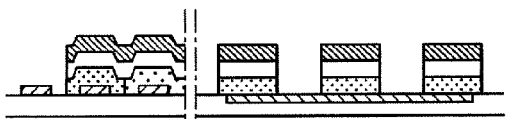
Figure 5J:
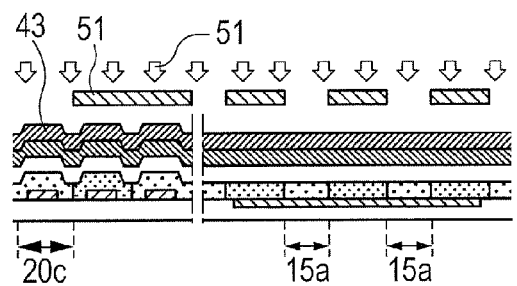
Figure 5M:
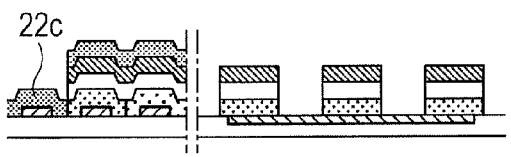
Figure 5K:
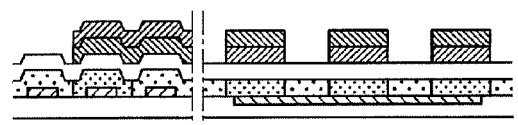
Figure 5N:
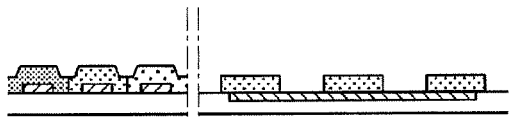

FIGS. 5A to 5N are schematic cross-sectional views illustrating a method of manufacturing an organic light emitting device according to a second embodiment of the present invention. Each step is hereinafter described based on a manufacturing process illustrated in FIGS. 5A to 5N. The manufacturing process illustrated in FIGS. 5A to 5N is a manufacturing process for manufacturing the organic light emitting device 1 of FIGS. 1A and 1B. A difference between the first embodiment and the second embodiment is hereinafter mainly described.

(1) Substrate Including Electrodes

In this embodiment, the substrate 10 on which the lower electrodes (21a, 21b, and 21c) described in the first embodiment are formed can be used.

(2) Step of Forming First Organic Compound Layer (FIG. 5A)

The first organic compound layer 22a can be formed by the method described in the first embodiment. In the present invention, as illustrated in this embodiment, specifically, in FIG. 5A, the first organic compound layer 22a is formed in the second region 12 including the region 15 as well as the first region 11 without using an area mask.

(3) Step of Processing First Organic Compound Layer (FIGS. 5B to 5F)

The first organic compound layer 22a can be processed by the method described in the first embodiment. In this step, the first organic compound layer 22a provided in the first region 11 and the second region 12 are processed respectively into intended shapes in such a manner that the first protective layer 41 and the second protective layer 42 are laminated.

Figure 6A:
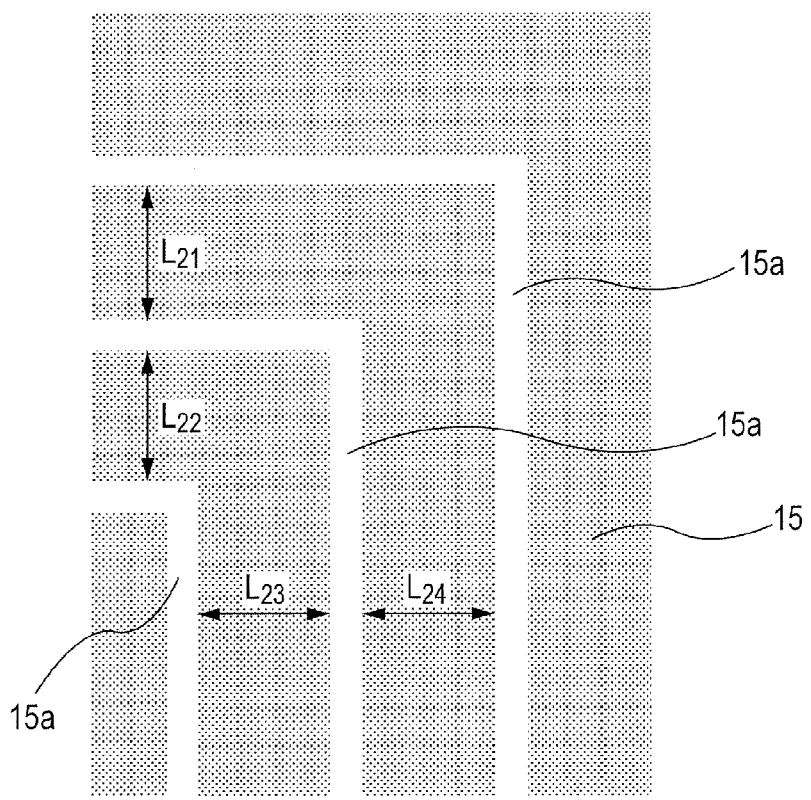
FIGS. 6A and 6B are schematic plan views illustrating an example of a processing region of the second protective layer in a second region.
Figure 6B:
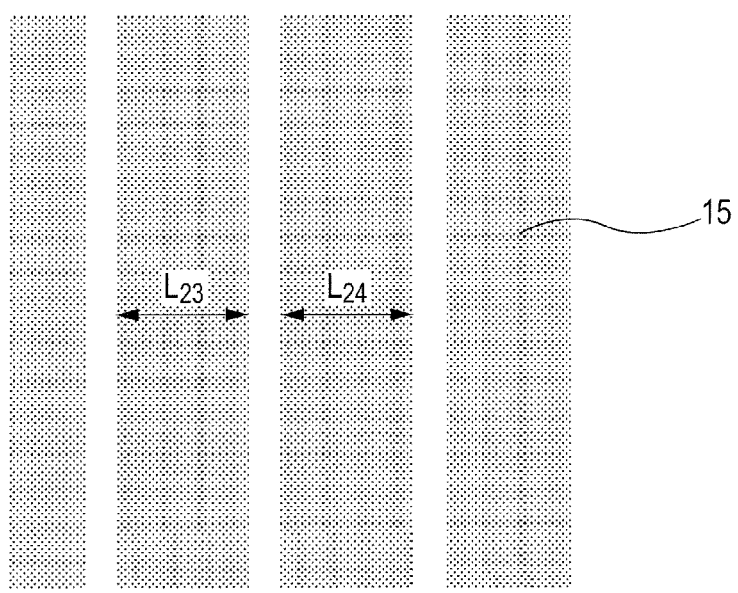

In this embodiment, the first organic compound layer 22a provided in the second region 12 is patterned, for example, into shapes as illustrated in FIGS. 6A and 6B. FIG. 6A illustrates a pattern of a γ portion of FIG. 1A, which is a corner portion of the region 15, and FIG. 6B illustrates a pattern of a β portion of FIG. 1A other than the corner portion of the region 15. Herein, the processing (removal) area 15a of the first organic compound layer 22a illustrated in FIGS. 6A and 6B is also a processing (removal) area of the second protective layer 42, and this area is provided in the region 15 in the same way as in the embodiment illustrated in FIG. 4. By setting the processing region in this way, an area in which a residue of an organic compound which causes encapsulation defects is not present is formed in the region 15 in such a manner that the area continuously surrounds the first region 11. Thus, when an encapsulation film or an encapsulation member is provided, by forming an encapsulation film so that the encapsulation film comes into contact with an area in which a residue of an organic compound is not present or by applying an adhesive for bonding an encapsulation member to outside of the area in which a residue of an organic compound is not present, an organic light emitting device with satisfactory encapsulation can be provided.

(4) Step of Forming Second Organic Compound Layer (FIG. 5G)

Similarly to the first organic compound layer 22a, the second organic compound layer 22b can be formed by the method described in the first embodiment.

(5) Step of Removing First Protective Layer (FIG. 5H)

The first protective layer 41 can be removed by the method described in the first embodiment, specifically, through use of release agent.

(6) Step of Processing Second Organic Compound Layer (FIGS. 5I to 5L)

Similarly to the first organic compound layer 22a, the second organic compound layer 22b can be processed by the method described in the first embodiment. In this step, the second organic compound layers 22b provided in the first region 11 and the second region 12 are processed respectively into intended shapes in such a manner that the first protective layer 41 and the second protective layer 42 are laminated.

(7) Step of Forming Third Organic Compound Layer (FIG. 5M)

Similarly to the first organic compound layer 22a and the second organic compound layer 22b, the third organic compound layer 22c can be formed by the method described in the first embodiment.

(8) Step of Removing First Protective Layer (FIG. 5N)

The first protective layer 41 can be removed by the method described in the first embodiment, specifically, through use of release agent.

(9) Step of Forming Electron Injection Layer, Step of Forming Second Electrode, and Encapsulation Step After patterning of the three kinds of organic compound layers (22a, 22b, and 22c) is finished as described above, organic light emitting elements are formed, and layers common to all the organic light emitting elements (electron injection layer, and the like) are formed. After the second electrode 23 is formed, an encapsulation layer or an encapsulation member for encapsulating the organic light emitting elements is provided. An organic light emitting device is obtained through the above-mentioned steps.

By using the manufacturing method of the present invention as described above, a solution can permeate into the release layer effectively even in a region other than the light emitting region, and the release layer is peeled to prevent a residue from being formed. Therefore, degradation and the like caused by encapsulation defects is prevented, with the result that a satisfactory organic light emitting device can be obtained.

Example 1

The organic light emitting device 1 of FIGS. 1A and 1B was produced based on the manufacturing process illustrated in FIGS. 3A to 3N.

(1) Substrate Including Electrodes

First, a glass substrate (substrate 10), on which a circuit layer including transistors and an insulating layer covering the circuit layer were provided, was prepared on a base member made of glass. On the substrate 10, as illustrated in FIG. 1A, a contact portion 13 was provided in an area which was in a second region 12 and on an inner side of a region 15, and an external connecting terminal 14 was provided in an area which was in the second region 12 and on an outer side of the region 15. Next, first electrodes (21a, 21b, and 21c) were formed in areas corresponding to light emitting portions by a method to be described below.

First, an Al alloy and ITO were formed into films in this order over the entire surface of the substrate 10 by a sputtering method so as to form a conductive thin film layer made of an Al alloy film and an ITO film. Next, the conductive thin film layer was patterned by photolithography and divided on a light emitting portion basis to form multiple first electrodes (21a, 21b, and 21c) in row and column directions.

Next, the substrate 10 on which the first electrodes (21a, 21b, and 21c) were formed was subjected to UV ozone treatment to wash the surfaces of the respective first electrodes (21a, 21b, and 21c). The substrate 10 produced through the above-mentioned steps was used as a substrate including electrodes in the following steps.

(2) Step of Forming First Organic Compound Layer (FIG. 3A)

A first organic compound layer 22a including a hole transport layer, a first emission layer, and an electron transport layer laminated in this order was formed by a vacuum vapor deposition method through use of an area mask having openings in a first region 11 (FIG. 3A).

First, an α-NPD was formed into a film on the substrate 10 and the first electrodes (21a, 21b, and 21c) to form the hole transport layer. In this case, the thickness of the hole transport layer was set to 200 nm. Next, CBP (host) and Ir(piq)$_3$ (guest) were co-deposited from the vapor on the hole transport layer to form a first emission layer (red emission layer). In this case, the thickness of the first emission layer was set to 80 nm. Then, a chrysene-based material was formed into a film on the first emission layer to form the electron transport layer having a function of blocking holes. In this case, the thickness of the electron transport layer was set to 10 nm.

(3) Step of Processing First Organic Compound Layer (FIGS. 3B to 3F)

Next, the first organic compound layer 22a was processed by a procedure described below.

First, there was prepared a PVP solution in which polyvinyl pyrrolidone (PVP) was dissolved in pure water so as to be 5% by weight. Next, the PVP solution was applied over the entire surface of the substrate 10 (on the side on which the first organic compound layer 22a was provided) by a spin coating method to thereby form a first protective layer 41 (FIG. 3B). In this case, the thickness of the first protective layer 41 was 0.5 μm.

Next, a silicon nitride film was formed on the first protective layer 41 to form a second protective layer 42 by a CVD method (FIG. 3C). In this case, the thickness of the second protective layer 42 was set to 0.3 μm.

Next, a positive photoresist material (OFPR-800, manufactured by Tokyo Ohka Kogyo Co., Ltd.) was formed into a film to form a resist layer 43. Then, the resist layer 43 was irradiated with light through use of a mask having openings in an area other than the first organic light emitting element 20a for the first region 11 and in processing regions of the second protective layer 42 and the first protective layer 41 for the second region 12 (FIG. 3D). Next, the resist layer 43 was developed through use of a developer (NMD-3, manufactured by Tokyo Ohka Kogyo Co., Ltd.) (FIG. 3E).

Next, by removing, through use of the developed resist layer 43 as a mask, the second protective layer 42 provided in an area not covered with the mask made of the resist layer 43 by a dry etching method using fluorocarbon gas, the second protective layer 42 was processed. In this example, as illustrated in FIG. 4, portions 15a in the second protective layer 42 provided in the region 15 were selectively removed.

FIG. 4 illustrates minimum distances $L_{11}$ to $L_{16}$ between the respective processing regions (15a) of the second protective layer 42 in the second region 12. In this example, the minimum distance between the respective processing regions (15a) of the second protective layer 42 in the first region 11 was set to 30 μm. On the other hand, the width of the region 15 was set to 700 μm, and the respective processing regions (15a) of the second protective layer 42 in the second region 12 were formed into a substantially rectangular shape of 150 μm×40 μm. $L_{11}$ to $L_{16}$ illustrated in FIG. 4 were all set to 50 μm.

Next, the first protective layer 41 and the first organic compound layer 22a were etched in order in accordance with the respective processing regions of the second protective layer 42, which were respectively provided in the first region 11 and the second region 12, by a dry etching method using fluorocarbon gas (FIG. 3F).

(4) Step of Forming Second Organic Compound Layer (FIG. 3G)

A second organic compound layer 22b including the hole transport layer, a second emission layer, and the electron transport layer laminated in this order was formed (FIG. 3G).

First, an α-NPD was formed into a film on the substrate 10 and the first electrodes (21a, 21b, and 21c) to form the hole transport layer by a vacuum vapor deposition method. In this case, the thickness of the hole transport layer was set to 200 nm. Next, tetraphenylbutadiene, which was a light emitting material, was added to a 1% by weight of a xylene solution containing a poly(p-phenylene vinylene) derivative polymer material (MEH-PPV) as a main component and applied onto the hole transport layer to form a second emission layer (blue emission layer). In this case, the thickness of the second emission layer was set to 40 nm. Next, a chrysene-based material was formed into a film on the second emission layer to form the electron transport layer having a function of blocking holes by a vacuum vapor deposition method. In this case, the thickness of the electron transport layer was set to 10 nm.

(5) Step of Removing First Protective Layer (FIG. 3H)

Next, the substrate on which the second organic compound layer 22b was formed was soaked in water to remove the first protective layer (FIG. 3H).

(6) Step of Processing Second Organic Compound Layer (FIGS. 3I to 3L)

Next, the second organic compound layer 22b was processed by the same processing step as that of the first organic compound layer 22a (FIGS. 3I to 3L). In this step, in the first region 11, the second organic compound layer 22b formed in an area in which the third organic light emitting element 20c was provided was removed, and in the second region 12, the second organic compound layer 22b formed in areas corresponding to portions 15a in FIGS. 3J and 4 was removed.

(7) Step of Forming Third Organic Compound Layer (FIG. 3M)

A third organic compound layer 22c including the hole transport layer, a third emission layer, and the electron transport layer laminated in this order was formed (FIG. 3M).

First, an α-NPD was formed into a film on the substrate 10 and the first electrodes (21a, 21b, and 21c) to form the hole transport layer by a vacuum vapor deposition method. In this case, the thickness of the hole transport layer was set to 200 nm. Next, coumarin 6, which was a light emitting material, was added to a 1% by weight of a xylene solution containing a poly(p-phenylene vinylene) derivative polymer material (MEH-PPV) as a main component and applied onto the hole transport layer to form a third emission layer (green emission layer). In this case, the thickness of the third emission layer was set to 50 nm. Next, a chrysene-based material was formed into a film on the third emission layer to form the electron transport layer having a function of blocking holes by a vacuum vapor deposition method. In this case, the thickness of the electron transport layer was set to 10 nm.

(8) Step of Removing First Protective Layer (FIG. 3N)

The first protective layer 41 was removed by the same method as that of the above-mentioned Step (5).

(9) Step of Forming Common Layer, Step of Forming Second Electrode, and Encapsulation Step The substrate 10 on which three kinds of organic compound layers (22a, 22b, and 22c) were formed was placed in vacuum atmosphere and heated at 100° C. for 30 minutes to dissipate heat sufficiently. Next, a common layer common to all the light emitting portions was formed by a vacuum film forming method (not shown). Note that, the common layer is a laminate including the electron transport layer and the electron injection layer.

First, bathophenanthroline was formed into a film, thereby forming the electron transport layer. In this case, the thickness of the electron transport layer was set to 10 nm. Next, bathophenanthroline and cesium carbonate ($Cs_2CO_3$) were co-deposited from the vapor so that the ratio between bathophenanthroline and $Cs_2CO_3$ was 7:3 in terms of volume ratio, thereby forming the electron injection layer. In this case, the thickness of the electron injection layer was set to 60 nm.

Next, Ag was formed into a film by a sputtering method, thereby forming a second electrode 23. In this case, the thickness of the second electrode 23 was set to 12 nm. Finally, a silicon nitride film was formed by a CVD method on the entire surface in which the light emitting portion of the substrate 10 was formed, thereby forming an encapsulation film. In this case, the thickness of the encapsulation film was set to 6 μm. In this way, the organic light emitting device 1 provided with three kinds of the organic light emitting elements (20a, 20b, and 20c) was obtained.

Multiple organic light emitting devices obtained by the above-mentioned method were supplied with a current and light emission from each light emitting portion was checked, with the result that satisfactory light emission was obtained.

Example 2

The organic light emitting device 1 of FIGS. 1A and 1B was produced based on the manufacturing process illustrated in FIGS. 5A to 5N.

(1) Substrate Including Electrodes

A substrate including electrodes, in which multiple first electrodes (21a, 21b, and 21c) were formed, was manufactured by the same method as that of Example 1.

(2) Step of Forming First Organic Compound Layer (FIG. 5A)

First, poly(3,4)ethylenedioxythiophene/polystyrenesulfonate (PEDT/PSS, Baytron P, manufactured by Bayer AG) was applied to the entire substrate surface on which the first electrodes (21a, 21b, and 21c) were formed to form a coating film by a spin coating method. Next, the coating film was dried to form a hole injection layer. In this case, the thickness of the hole injection layer was set to 100 nm. Next, a solution obtained by adding Ir(piq)$_3$ to a 2% by weight of a toluene solution prepared by mixing a light emitting material containing polyvinylcarbazole as a main component and toluene was applied to the entire surface of the hole injection layer to form a coating film by a spin coating method. Next, the coating film was dried to form a first emission layer (red emission layer). In this case, the thickness of the first emission layer was set to 80 nm. A first organic compound layer 22a made of the hole injection layer and the first emission layer was formed by the process described above (FIG. 5A).

(3) Step of Processing First Organic Compound Layer (FIGS. 5B to 5F)

Next, polyvinyl pyrrolidone (PVP) and pure water were mixed to prepare a 5% by weight of a PVP aqueous solution. Then, the PVP aqueous solution was applied to the entire surface on which the first organic compound layer 22a was formed to obtain a coating film by a spin coating method. Next, the coating film was heated at 100° C. for 10 minutes to form a first protective layer 41 (FIG. 5B). In this case, the thickness of the first protective layer 41 was set to 0.5 μm.

Next, the substrate 10 on which the first protective layer 41 was formed was placed in the CVD film forming device. Then, silicon nitride was formed into a film on the first protective layer 41 by CVD to form the second protective layer 42 (FIG. 5C). In this case, the thickness of the second protective layer 42 was set to 1 μm.

Next, a positive photoresist material (OFPR-800, manufactured by Tokyo Ohka Kogyo Co., Ltd.) was formed into a film to form a resist layer 43. Then, the resist layer 43 was irradiated with light through use of a mask having openings in an area other than the first organic light emitting element 20a for the first region 11 and in processing regions of the second protective layer 42 and the first protective layer 41 for the second region 12 (FIG. 3D). Next, the resist layer 43 was developed through use of a developer (NMD-3, manufactured by Tokyo Ohka Kogyo Co., Ltd.) (FIG. 3E).

Next, the substrate 10 including the developed resist layer 43 was placed in a dry etching device. Next, by removing, through use of the developed resist layer 43 as a mask, the second protective layer 42 provided in an area not covered with the mask made of the resist layer 43 by a dry etching method using fluorocarbon gas, the second protective layer 42 was processed. In this example, as illustrated in FIGS. 6A and 6B, the second protective layer 42 provided in the region 15 was partially removed.

FIGS. 6A and 6B illustrates minimum distances $L_{21}$ to $L_{24}$ between the respective processing regions (15a) of the second protective layer 42 in the second region 12. In this example, the width of the region 15 was set to 800 μm, each processing region of the second protective layer 42 in the second region 12 was formed into a stripe shape having a width of 10 μm, and $L_{21}$ to $L_{24}$ illustrated in FIGS. 6A and 6B were all set to 50 μm.

Next, the first protective layer 41 and the first organic compound layer 22a were etched in order along the respective processing regions of the second protective layer 42, which were respectively provided in the first region 11 and the second region 12, by a dry etching method using oxygen plasma. When the resist layer 43 was etched with oxygen plasma, and partial removal of the first protective layer 41 and the first organic compound layer 22a was completed, the resist layer 43 remaining in an area in which the first organic light emitting element 20a was provided was completely removed (FIG. 5F).

(4) Step of Forming Second Organic Compound Layer (FIG. 5G)

A second organic compound layer 22b including a hole transport layer, a second emission layer, and a hole blocking layer laminated in this order was formed by a vacuum vapor deposition method (FIG. 5G).

First, a molybdenum oxide was formed into a film to form a hole injection layer. In this case, the thickness of the hole injection layer was set to 1 nm. Next, an α-NPD was formed into a film to form a hole transport layer on the hole injection layer. In this case, the thickness of the hole transport layer was set to 160 nm. Next, $Alq_3$ (host) and coumarin 6 (guest) were co-deposited from the vapor on the hole transport layer to form a second emission layer (green emission layer). In this case, the thickness of the second emission layer was set to 50 nm. Then, a chrysene-based material was formed into a film on the second emission layer to form a hole blocking layer. In this case, the thickness of the hole blocking layer was set to 10 nm.

(5) Step of Removing First Protective Layer (FIG. 5H)

Next, a substrate on which the second organic compound layer 22b was formed was soaked in pure water and subjected to ultrasonic vibration to remove the first protective layer 41 (FIG. 5H). In this case, the second protective layer 42 and the second organic compound layer 22b formed on the first protective layer 41 were also removed together with the first protective layer 41.

(6) Step of Processing Second Organic Compound Layer (FIGS. 5I to 5L)

Next, the second organic compound layer 22b was processed by the same processing step as that of the first organic compound layer 22a (FIGS. 5I to 5L). In this step, in the first region 11, the second organic compound layer 22b formed in an area in which the third organic light emitting element 20c was provided was removed, and in the second region 12, the second organic compound layer 22b formed in areas corresponding to portions 15a of FIG. 6A was removed.

(7) Step of Forming Third Organic Compound Layer (FIG. 5M)

A third organic compound layer 22c including a hole transport layer, a third emission layer, and a hole blocking layer laminated in this order was formed by a vacuum vapor deposition method (FIG. 5M). When the third organic compound layer 22c was formed, an area mask having openings in areas in which the third organic light emitting elements 20c were provided in the first region 11 was used.

First, a molybdenum oxide was formed into a film to form a hole injection layer. In this case, the thickness of the hole injection layer was set to 1 nm. Next, an α-NPD was formed into a film to form a hole transport layer on the hole injection layer. In this case, the thickness of the hole transport layer was set to 100 nm. Next, an anthracene derivative (host) and perylene (guest) were co-deposited from the vapor on the hole transport layer to form a third emission layer (blue emission layer). In this case, the thickness of the third emission layer was set to 30 nm. Then, a chrysene-based material was formed into a film on the third emission layer to form a hole blocking layer. In this case, the thickness of the hole blocking layer was set to 10 nm.

(8) Step of Removing First Protective Layer (FIG. 5N)

The first protective layer 41 was removed by the same method as that of the above-mentioned step (5).

(9) Step of Forming Common Layer, Step of Forming Second Electrode, and Encapsulation Step The substrate 10 on which three kinds of organic compound layers (22a, 22b, and 22c) were formed was placed in vacuum atmosphere and heated at 100° C. for 30 minutes to dissipate heat sufficiently. Next, a common layer common to all the light emitting portions was formed by a vacuum film forming method (not shown). Note that, the common layer is a laminate including an electron transport layer and an electron injection layer.

First, bathophenanthroline was formed into a film, thereby forming the electron transport layer. In this case, the thickness of the electron transport layer was set to 10 nm. Next, bathophenanthroline and cesium carbonate ($Cs_2CO_3$) were co-deposited from the vapor so that the ratio between bathophenanthroline and $Cs_2CO_3$ was 7:3 in terms of volume ratio, thereby forming the electron injection layer. In this case, the thickness of the electron injection layer was set to 60 nm.

Next, Ag was formed into a film by a sputtering method, thereby forming the second electrode 23. In this case, the thickness of the second electrode 23 was set to 12 nm. Finally, a silicon nitride film was formed by a CVD method on the entire surface in which the light emitting portion of the substrate 10 was formed, thereby forming an encapsulation film. In this case, the thickness of the encapsulation film was set to 6 μm. In this way, the organic light emitting device 1 provided with three kinds of the organic light emitting elements (20a, 20b, and 20c) was obtained.

Multiple organic light emitting devices obtained by the above-mentioned method were supplied with a current and light emission from each light emitting portion was checked, with the result that satisfactory light emission was obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-029730, filed Feb. 14, 2012, which is hereby incorporated by reference herein in its entirety.

REFERENCE SIGNS LIST

1: organic light emitting device, 10: substrate, 11: first region (light emitting region), 12: second region, 13: contact portion, 14: external connecting terminal, 15: region surrounding the first region, 15a: processing region (of first protective layer and the like of second region), 20a (20b, 20c): organic light emitting element, 21a (21b, 21c): first electrode, 22a: first organic compound layer, 22b: second organic compound layer, 22c: third organic compound layer, 23: second electrode, 30: encapsulation member, 41: first protective layer, 42: second protective layer, 43: resist layer, 52: photomask.

What is claimed is:

1. A method of manufacturing an organic light emitting device,
the organic light emitting device comprising:
a substrate on which a first region and a second region are provided, the first region being a light emitting region having multiple light emitting portions, the second region being provided on a periphery of the first region; and
first electrodes formed respectively in areas corresponding to the multiple light emitting portions,
the method comprising:
a first organic compound layer formation step of forming a first organic compound layer including a first emission layer at least in the first region;
a first protective layer formation step of forming a first protective layer including a release layer over an entire surface of the substrate on which the first organic compound layer is formed;
a second protective layer formation step of forming a second protective layer on the first protective layer;
a second protective layer processing step of removing a part of the second protective layer to obtain a patterned second protective layer;
a first protective layer and first organic compound layer processing step of removing a part of the first protective layer and the first organic compound layer in accordance with the pattern of the second protective layer to obtain a patterned first protective layer and a patterned first organic compound layer;

a second organic compound layer formation step of forming a second organic compound layer including a second emission layer over an entire surface of the substrate on which the patterned first organic compound layer is formed; and a lift-off step of bringing the release layer into contact with release agent for selectively removing the release layer, to thereby remove at least the release layer together with a layer formed above the release layer, wherein an area from which the second protective layer is removed in the second protective layer processing step is provided also in the second region, and wherein a minimum value of an interval between areas from which the second protective layer is removed in the second region is 100 times or less a minimum value of an interval between areas from which the second protective layer is removed in the first region.

2. The method of manufacturing an organic light emitting device according to claim 1, wherein the second protective layer processing step comprises forming the areas from which the second protective layer is removed so that the areas are dispersed so as to surround the first region.

3. The method of manufacturing an organic light emitting device according to claim 1, wherein the second protective layer processing step comprises forming the areas from which the second protective layer is removed so that the areas continuously surround the first region.

4. The method of manufacturing an organic light emitting device according to claim 1, further comprising an encapsulation step of forming an encapsulation layer for covering the first region after the lift-off step, wherein the encapsulation step comprises forming the encapsulation layer so that the encapsulation layer extends to the area from which the second protective layer is removed in the second protective layer processing step.

5. The method of manufacturing an organic light emitting device according to claim 1, further comprising, between the second protective layer formation step and the second protective layer processing step:

a resist layer formation step of forming a resist layer on the second protective layer; and a patterning step of patterning the resist layer by photolithography, wherein the second protective layer processing step comprises removing the second protective layer in an area not covered with the resist layer.

6. The method of manufacturing an organic light emitting device according to claim 1, wherein the second protective layer processing step and the first protective layer and first organic compound layer processing step are performed by dry etching.

7. The method of manufacturing an organic light emitting device according to claim 1, wherein the release layer comprises a water-soluble polymer material.

8. The method of manufacturing an organic light emitting device according to claim 1, wherein the second protective layer comprises an inorganic material.

* * * * *